United States Patent
Padmanabhan et al.

(10) Patent No.: US 6,833,781 B1
(45) Date of Patent: Dec. 21, 2004

(54) HIGH Q INDUCTOR IN MULTI-LEVEL INTERCONNECT

(75) Inventors: Gobi R. Padmanabhan, Sunnyvale, CA (US); Visvamohan Yegnashankaran, Redwood City, CA (US)

(73) Assignee: National Semiconductor Corporation, Santa Clara, CA (US)

( * ) Notice: Subject to any disclaimer, the term of this patent is extended or adjusted under 35 U.S.C. 154(b) by 0 days.

(21) Appl. No.: 10/184,212

(22) Filed: Jun. 27, 2002

(51) Int. Cl.[7] ................................................ H01F 5/00
(52) U.S. Cl. .................. 336/200; 336/225; 336/223; 336/180; 336/65; 257/537
(58) Field of Search ................................ 336/200, 233, 336/225, 65, 180, 84 R, 139; 257/531; 29/602.1

(56) References Cited

U.S. PATENT DOCUMENTS

| | | | | |
|---|---|---|---|---|
| 5,610,433 A | * | 3/1997 | Merrill et al. | 257/531 |
| 6,031,445 A | * | 2/2000 | Marty et al. | 336/200 |
| 6,037,649 A | * | 3/2000 | Liou | 257/531 |
| 6,242,791 B1 | | 6/2001 | Jou | 257/531 |
| 6,320,491 B1 | | 11/2001 | Gevorgian et al. | 336/200 |

* cited by examiner

*Primary Examiner*—Lincoln Donovan
*Assistant Examiner*—Jennifer A. Poker
(74) *Attorney, Agent, or Firm*—Mark C. Pickering

(57) ABSTRACT

An inductor is formed from the interconnect structure of a semiconductor chip, using the vias and metal regions to form up and down segments of a loop, and horizontal metal lines to form the top and bottom segments of the loop. In addition, a second inductor can be formed between or under the first inductor to form an inductive system, such as a transformer.

20 Claims, 9 Drawing Sheets

HIGH Q INDUCTOR IN MULTI-LEVEL INTERCONNECT

BACKGROUND OF THE INVENTION

1. Field of the Invention

The present invention relates to inductors and, more particularly, to a high Q inductor that is formed in a multi-level interconnect.

2. Description of the Related Art

Low-loss, linear inductors are common circuit elements in radio frequency (RF) applications, such as digital cellular telephones. These devices tend to be quite large with respect to the digital circuitry, and are one of the limiting factors in further significant reductions in the size of digital cellular telephones.

For example, one important measure of an inductor is the quality factor or Q of the inductor. High Q inductors are desirable in a number of RF circuits, such as resonant circuits. The Q of an inductor is given by equation (EQ.) 1 as:

$$Q = \omega L/R, \quad \text{EQ. 1}$$

where ω is related to the frequency f of the signal applied to the inductor (ω=2(pi)(f)), L represents the inductance of the inductor, and R represents the resistance of the inductor.

As indicated by EQ. 1, the smaller the resistance, the higher the Q of the inductor. One common approach to reducing the resistance of an inductor is to increase the size of the inductor. As a result, high Q inductors are often implemented at the circuit board level as discrete components, requiring a significant amount of circuit board space.

Another approach to providing an integrated circuit with high Q inductors is to fabricate both the electrical circuit and the high Q inductors on the same semiconductor substrate. This approach, however, typically suffers from a number of drawbacks, including induced substrate currents and relatively thick metal layers.

A further approach to providing an integrated circuit with high Q inductors is to utilize micro-electromechanical systems (MEMS) technology. For example, using MEMS technology, the functionality of a low-loss inductor can be provided by using micron-sized electromechanical structures.

Although techniques exist for providing an integrated circuit with high Q inductors, there is a continuing need for alternate structures and methods of forming the structures.

SUMMARY OF THE INVENTION

The present invention provides an integrated circuit with high Q inductors. An inductor of the present invention has a longitudinal centerline and a conductor that spirals around the longitudinal centerline a plurality of times to form a plurality of loops. Each loop, in turn, has a first vertical segment that has a first via, a second vertical segment that has a second via, a first horizontal segment that is connected to the first via and the second via, and a second horizontal segment that is connected to the second vertical segment.

The present invention can also include a second inductor that has a second conductor that spirals around the longitudinal centerline a plurality of times to form a plurality of loops. A loop of the second conductor is formed between adjacent loops of the first inductor. Each loop of the second conductor has a third vertical segment that has a third via, a fourth vertical segment that has a fourth via, a third horizontal segment that is connected to the third via and the fourth via, and a fourth horizontal segment that is connected to the fourth vertical segment.

The present invention can also include a second inductor that has a second conductor that spirals around the longitudinal centerline a plurality of times to form a plurality of loops. A number of the loops of the second conductor are formed directly under the loops of the first inductor. Each loop of the second conductor has a third vertical segment having a third via, a fourth vertical segment having a fourth via, a third horizontal segment that is connected to the third via and the fourth via, and a fourth horizontal segment that is connected to the fourth vertical segment.

A better understanding of the features and advantages of the present invention will be obtained by reference to the following detailed description and accompanying drawings which set forth an illustrative embodiment in which the principals of the invention are utilized.

BRIEF DESCRIPTION OF THE DRAWINGS

FIG. 1A is a plan view of inductor 100. FIG. 1B is a side view taken along line 1B—1B of FIG. 1A. FIG. 1C is a side view taken along line 1C—1C of FIG. 1A. FIG. 1D is an end view taken along line 1D—1D of FIG. 1A.

FIG. 2A is a plan view of inductor 200. FIG. 2B is a side view taken along line 2B—2B of FIG. 2A. FIG. 2C is an end view taken along line 2C—2C of FIG. 2A.

FIG. 3A is a plan view of system 300. FIG. 3B is a side view taken along line 3B—3B of FIG. 3A. FIG. 3C is an end view taken along line 3C—3C of FIG. 3A.

FIG. 4A is a plan view of system 400. FIG. 4B is a side view taken along line 4B—4B of FIG. 4A. FIG. 4C is an end view taken along line 4C—4C of FIG. 4A.

FIG. 5A is a plan view of system 500. FIG. 5B is a side view taken along line 5B—5B of FIG. 5A. FIG. 5C is an end view taken along line 5C—5C of FIG. 5A.

FIG. 6A is a plan view of system 600. FIG. 6B is a side view taken along line 6B—6B of FIG. 6A. FIG. 6C is an end view taken along line 6C—6C of FIG. 6A.

DETAILED DESCRIPTION

Figure 1A:
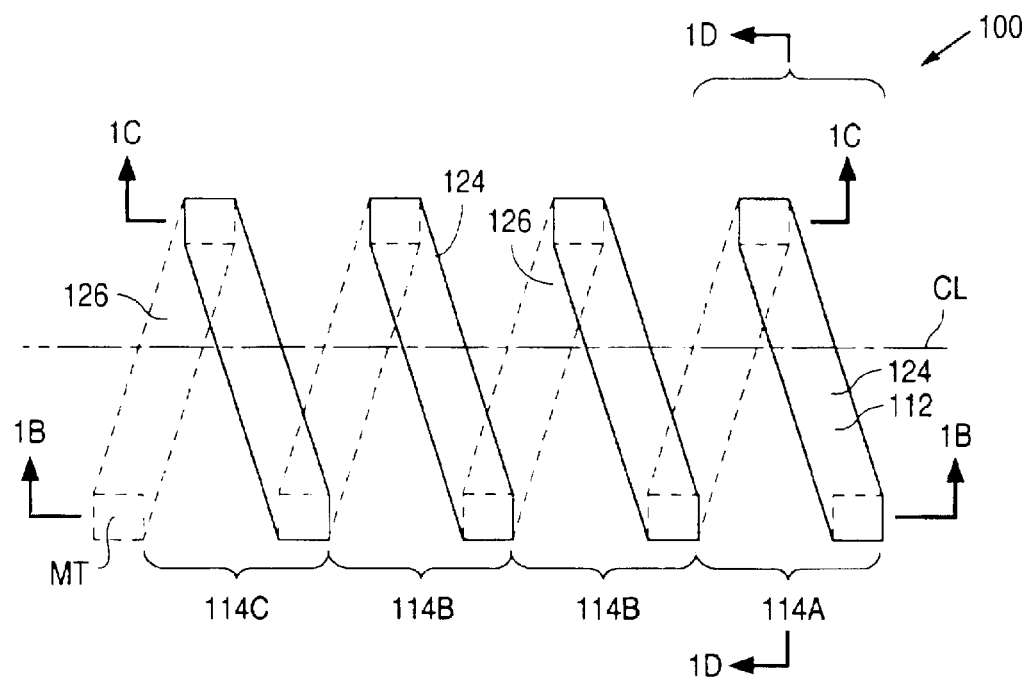
FIGS. 1A–1D are views illustrating a high Q inductor 100 in accordance with the present invention.
Figure 1B:
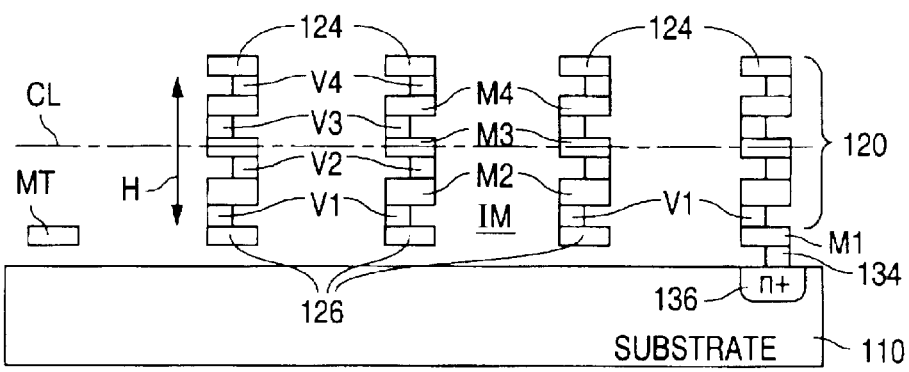
Figure 1C:
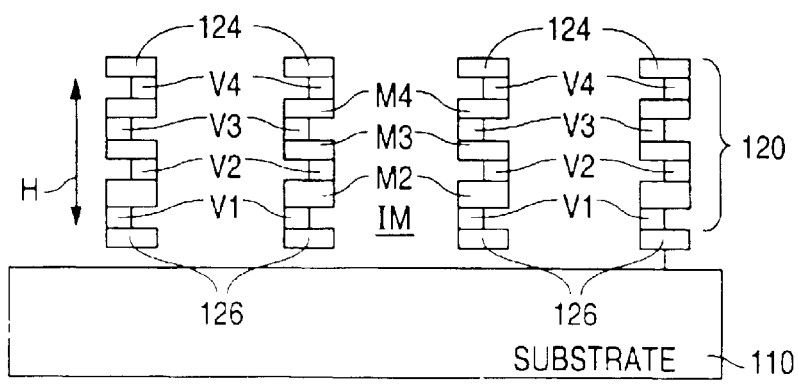
Figure 1D:
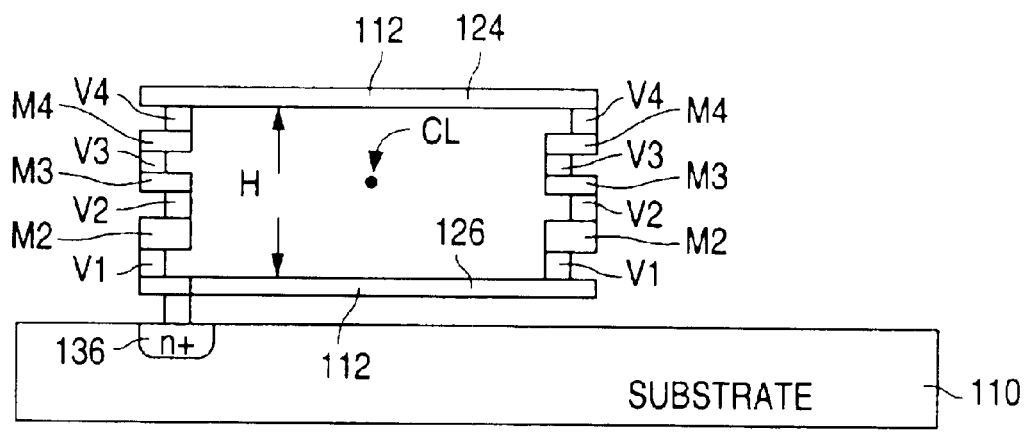

FIGS. 1A–1D show views that illustrate a high Q inductor 100 in accordance with the present invention. FIG. 1A shows a plan view of inductor 100. FIG. 1B shows a side view taken along line 1B—1B of FIG. 1A. FIG. 1C shows a side view taken along line 1C—1C of FIG. 1A. FIG. 1D shows an end view taken along line 1D—1D of FIG. 1A.

As shown in FIGS. 1A–1D, inductor 100, which is formed over a semiconductor material 110, has a longitudinal centerline CL that is parallel with the top surface of substrate 110, and a conductor 112 that spirals around centerline CL a number of times to form a number of loops 114.

The loops 114 include a first loop 114A, a number of intermediate loops 114B, and a last loop 114C. Each loop 114, in turn, has an up segment 120, a down segment segment 122, a top segment 124 that is connected to the up and down segments 120 and 122, and a bottom segment 126 that is connected to up segment 120 or down segment 122.

Up segment 120 and down segment 122 each have at least one via and, in the example shown in FIGS. 1A–1D, have three vertically-adjacent metal regions, region M2, region M3, and region M4; and four vias, via V1 attached to the bottom of region M2, via V2 connected between regions M2 and M3, via V3 connected between regions M3 and M4, and via V4 connected to the top surface of metal region M4.

Top segment 124 and bottom segment 126 each have a first end and a spaced-apart second end. In the example shown in FIGS. 1A–1D, top segment 124 is a metal-5 line with the first and second ends connected to the vias V4 in up and down segments 120 and 122. In addition, bottom segment 126 is a metal-1 line with the first end connected to via V1 in down segment 122.

The first and last loops 114A and 114C of inductor 100 can be connected to a semiconductor material, a metal trace, a local interconnect, or other semiconductor structures in any combination. In the example shown in FIGS. 1A–1D, first loop 114A is connected to semiconductor material 110, and includes a metal region M1 that is connected to the via V1 of an up segment 120, and a contact 134 that is connected to both metal region M1 and a contact region 136 that is formed in semiconductor substrate 110. Last loop 114C, on the other hand, is connected to a metal-1 trace MT.

Inductor 100 has a height measured from the top surface of the bottom segment 126 of a loop 114 to the bottom surface of the top segment 124 of the loop 114. In the example shown in FIGS. 1A–1D, inductor 100 has a height H measured from the top surface of metal-1 bottom segment 126 to the bottom surface of metal-5 top segment 124.

Figure 2A:
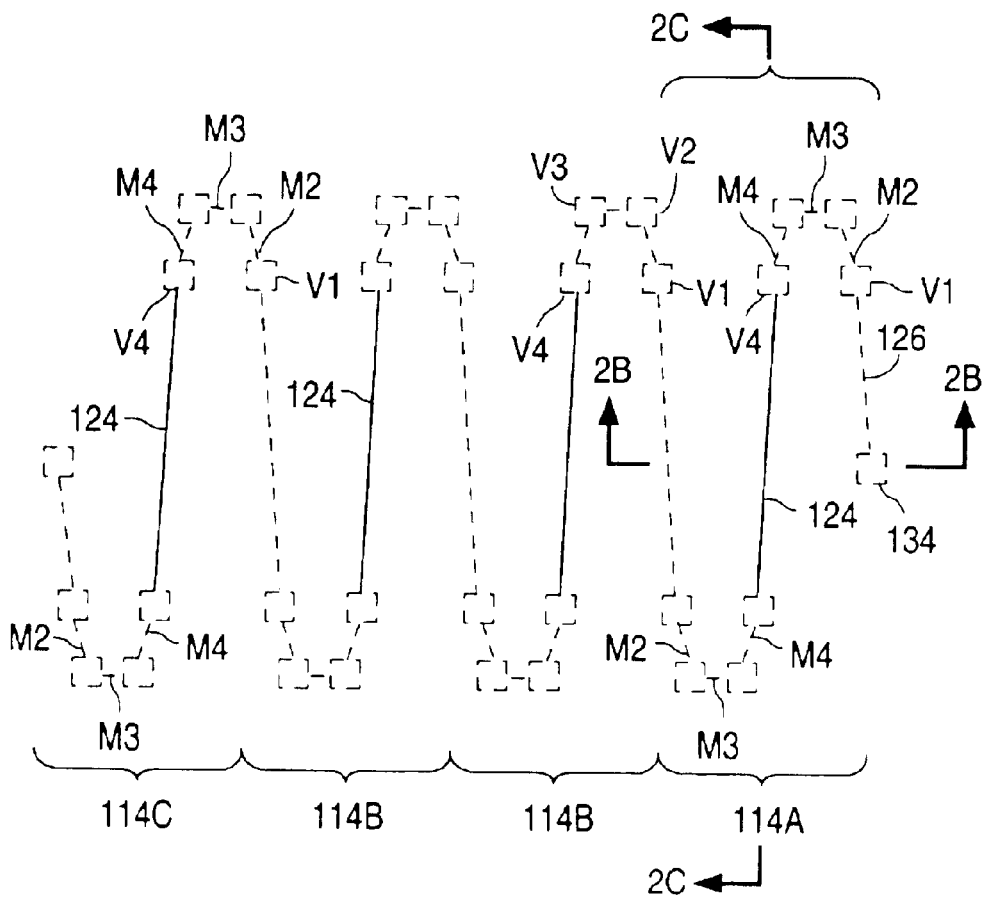
FIGS. 2A–2C are views illustrating a high Q inductor 200 in accordance with an alternate embodiment of the present invention.
Figure 2B:
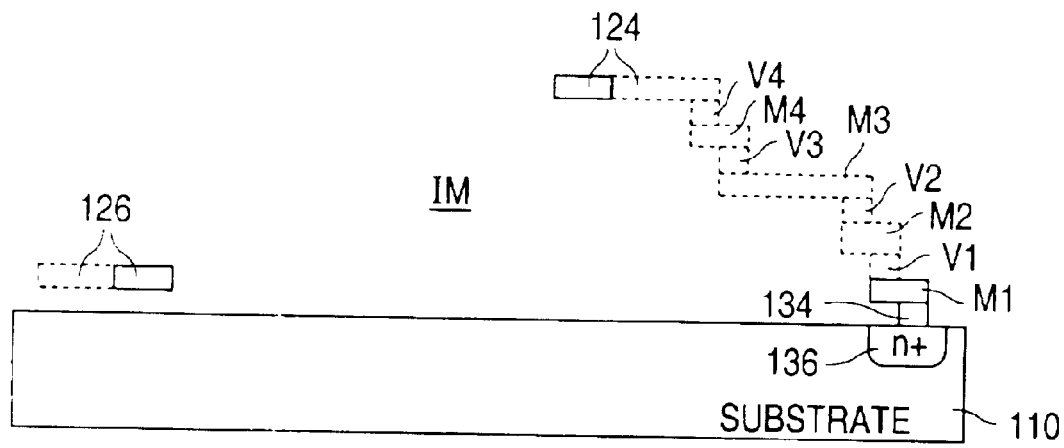
Figure 2C:
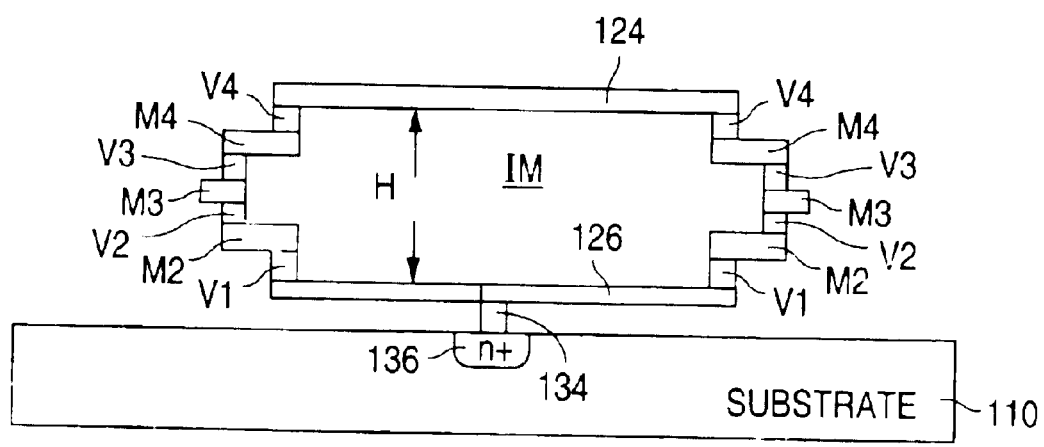

FIGS. 2A–2C show views that illustrate a high Q inductor 200 in accordance with an alternate embodiment of the present invention. FIG. 2A shows a plan view of inductor 200. FIG. 2B shows a side view taken along line 2B—2B of FIG. 2A. FIG. 2C shows an end view taken along line 2C—2C of FIG. 2A.

Inductor 200 is similar to inductor 100 and, as a result, utilizes the same reference numerals to designate the structures which are common to both inductors. Inductor 200 differs from inductor 100 in that there is no vertical overlap between non-adjacent metal regions.

As shown in FIG. 2A, top segment 124 (the metal-5 layer) does not vertically overlap metal region M3, and metal region M3 does not vertically overlap bottom segment 126 (the metal-1 layer). In addition, in contrast with inductor 100 where some of the vias V1–V4 lie directly over (or under) other vias V1–V4 in the same segment, none of the vias V1–V4 of inductor 200 are directly formed over each other, but instead have a stair-step structure.

As shown in FIGS. 2A–2C, when the non-adjacent metal layers do not overlap and none of the vias V1–V4 are directly formed over (or under) each other, an inductor can be formed with a more circular shape. (A more circular shape can also be formed when a larger number of metal layers are used.)

Figure 3A:
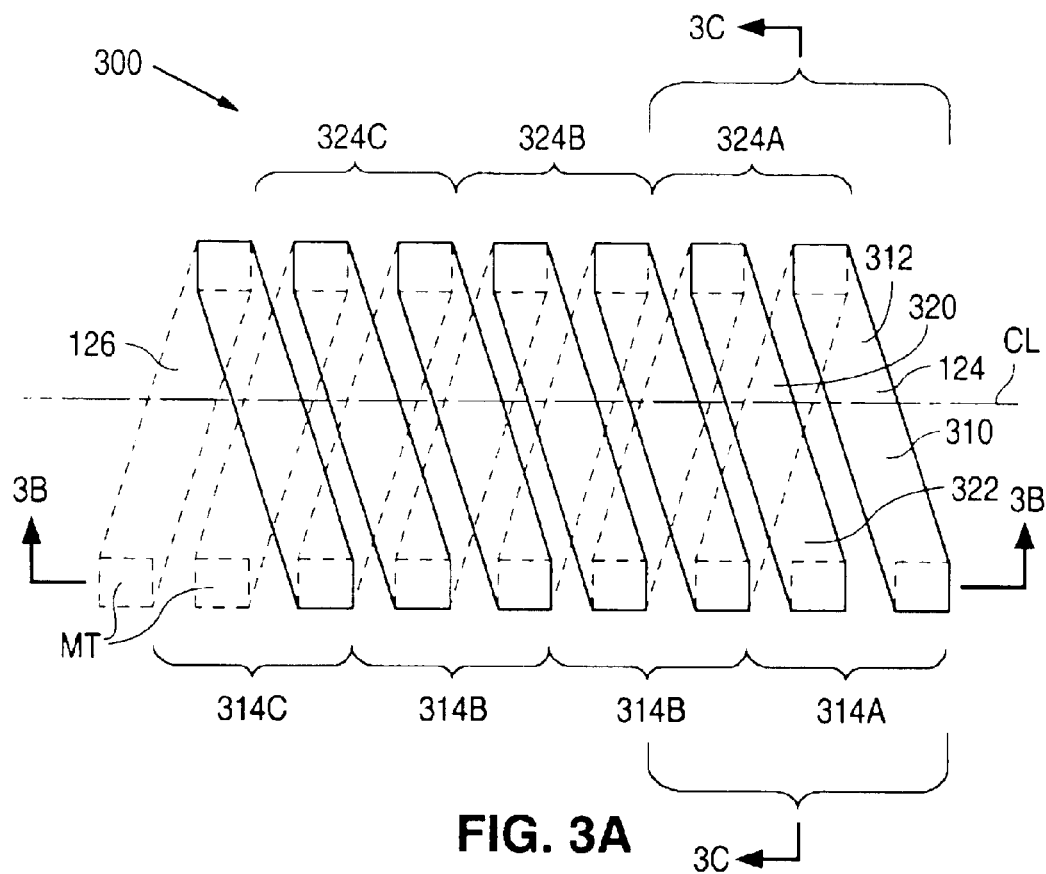
FIGS. 3A–3C are views illustrating a high Q inductance system 300 in accordance with the present invention.
Figure 3B:
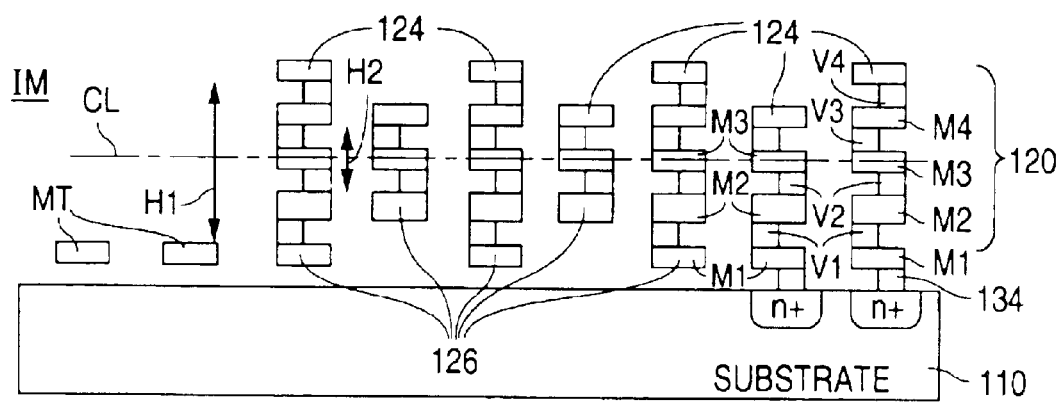
Figure 3C:
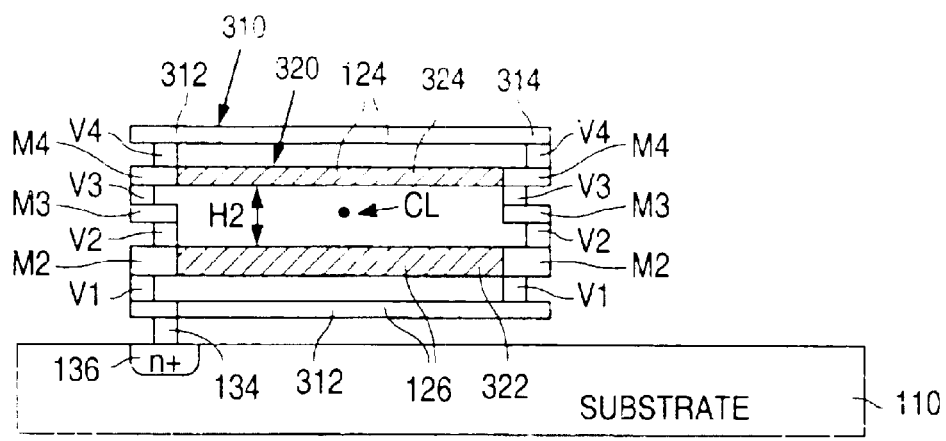

FIGS. 3A–3C show views that illustrate a high Q inductance system 300 in accordance with the present invention. FIG. 3A shows a plan view of system 300. FIG. 3B shows a side view taken along line 3B—3B of FIG. 3A. FIG. 3C shows an end view taken along line 3C—3C of FIG. 3A.

As shown in FIGS. 3A–3C, system 300, which can be implemented as, for example, a transformer, includes a first inductor 310 that has a longitudinal centerline CL and a first conductor 312 that spirals around centerline CL a number of times to form a number of loops 314.

In addition, system 300 includes a second inductor 320 that has a conductor 322 that spirals around the longitudinal centerline CL a number of times to form a number of loops 324 that are formed between the loops 314 of first inductor 310. (The loops 324 of second inductor 320 can also be formed on one or both of the outer sides of first inductor 310.)

The loops 314 include a first loop 314A, a number of intermediate loops 314B, and a last loop 314C, while the loops 324 include a first loop 324A, a number of intermediate loops 324B, and a last loop 324C. In the example shown in FIGS. 3A–3C, first inductor 310 and second inductor 320 are both formed as inductor 100.

In addition, the heights of inductors 310 and 320 can be the same, or different. In the example shown in FIGS. 3A–3C, inductor 310 has a height H1, and uses the metal-1 layer to form the bottom segment 126 of a loop 314, and the metal-5 layer to form the top segment 124 of a loop 314.

On the other hand, inductor 320 has a smaller height H2, and uses the metal-2 layer to form the bottom segment 126 of a loop 324, and the metal-4 layer to form the bottom segment 126 of a loop 324. (Two inductors with different heights require a minimum of four metal layers.)

Figure 4A:
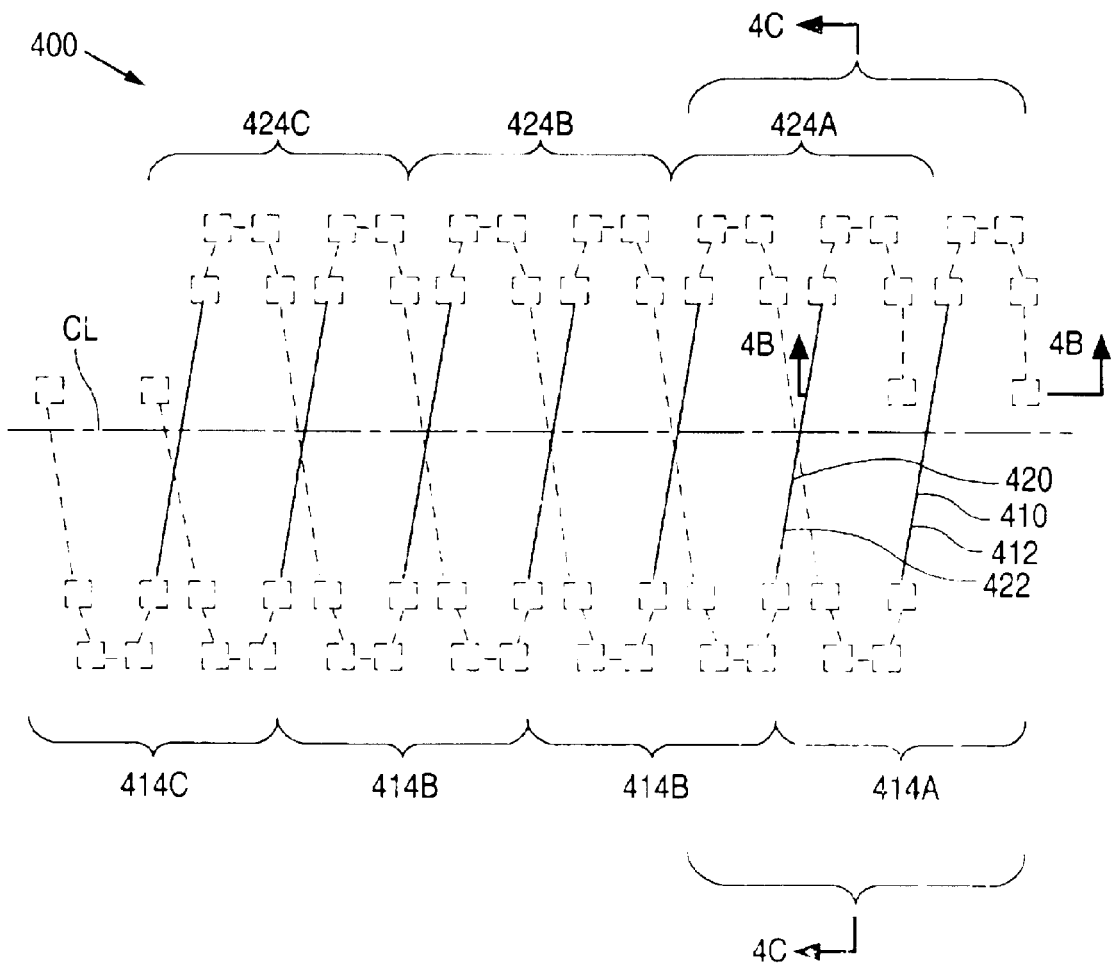
FIGS. 4A–4C are views illustrating a high Q inductance system 400 in accordance with the present invention.
Figure 4B:
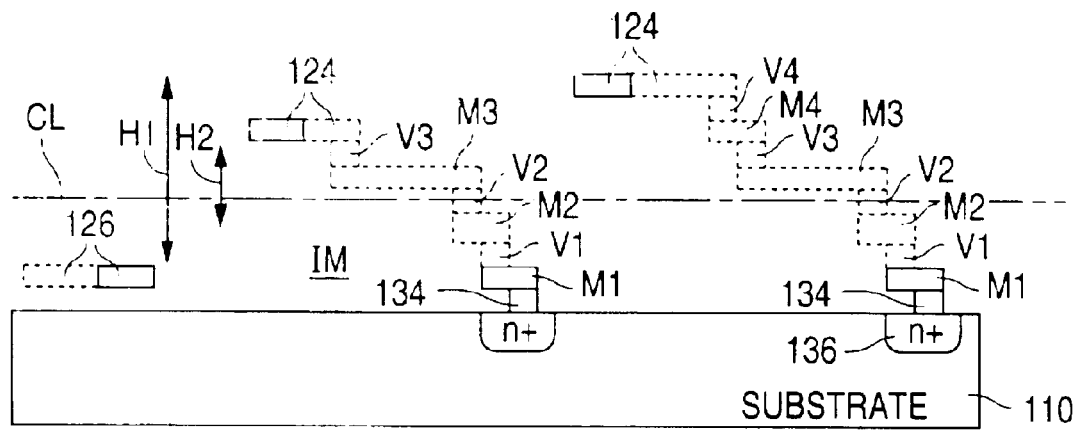
Figure 4C:
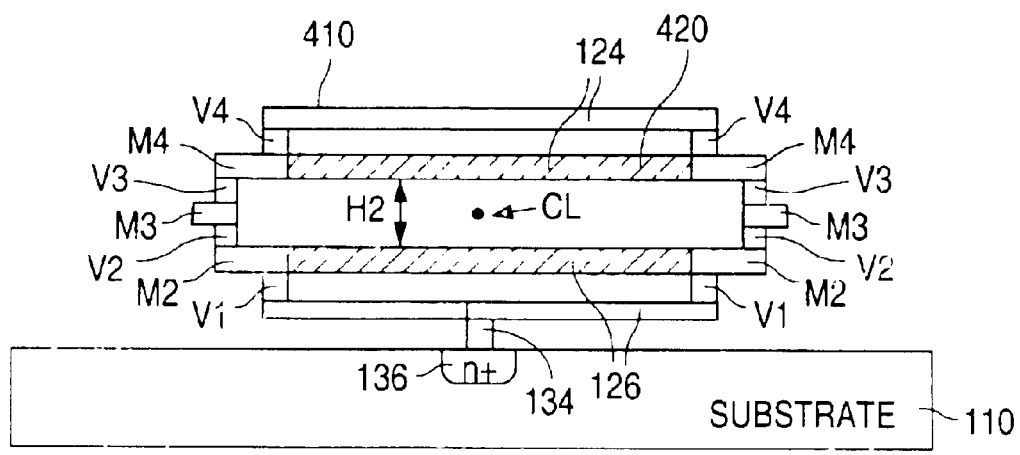

FIGS. 4A–4C show views that illustrate a high Q inductance system 400 in accordance with the present invention. FIG. 4A shows a plan view of system 400. FIG. 4B shows a side view taken along line 4B—4B of FIG. 4A. FIG. 4C shows an end view taken along line 4C—4C of FIG. 4A.

As shown in FIGS. 4A–4C, system 400, which can be implemented as, for example, a transformer, includes a first inductor 410 that has a longitudinal centerline CL, and a conductor 412 that spirals around centerline CL a number of times to form a number of loops 414.

In addition, system 400 includes a second inductor 420 that has a conductor 422 that spirals around the longitudinal centerline CL a number of times to form a number of loops 424 that are formed between the loops 414 of first inductor 410. (The loops 424 of second inductor 420 can also be formed on one or both of the outer sides of first inductor 410.).

The loops 414 include a first loop 414A, a number of intermediate loops 414B, and a last loop 414C, while the loops 424 include a first loop 424A, a number of intermediate loops 424B, and a last loop 424C. In the example shown in FIGS. 4A–4C, first inductor 410 and second inductor 420 are both formed as inductor 200. System 400 is similar to system 300 except that system 400 utilizes inductor 200 to form inductors 410 and 420.

Figure 5A:
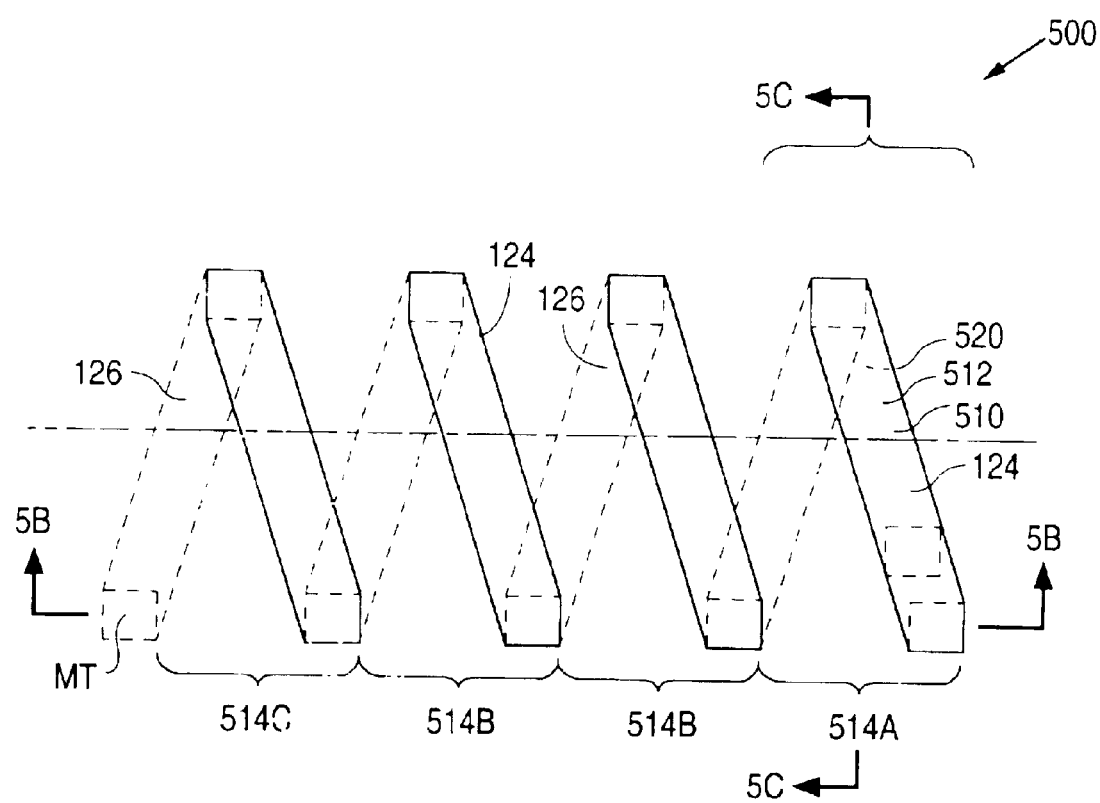
FIGS. 5A–5C are views illustrating a high Q inductance system 500 in accordance with the present invention.
Figure 5B:
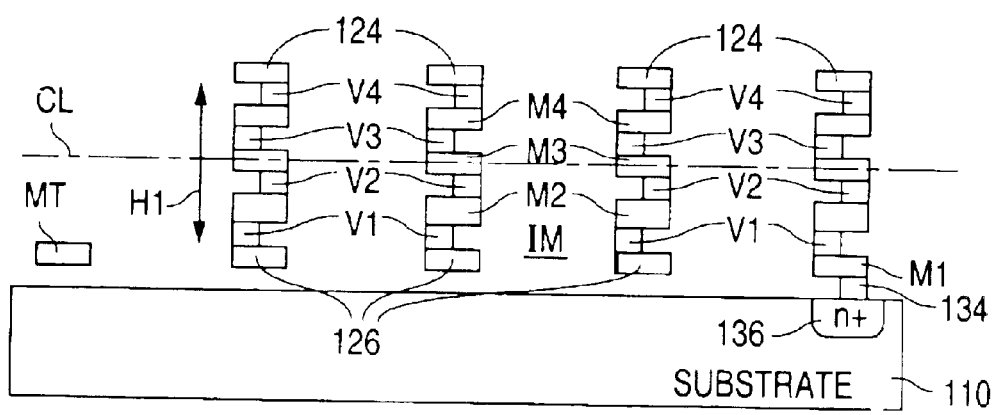
Figure 5C:
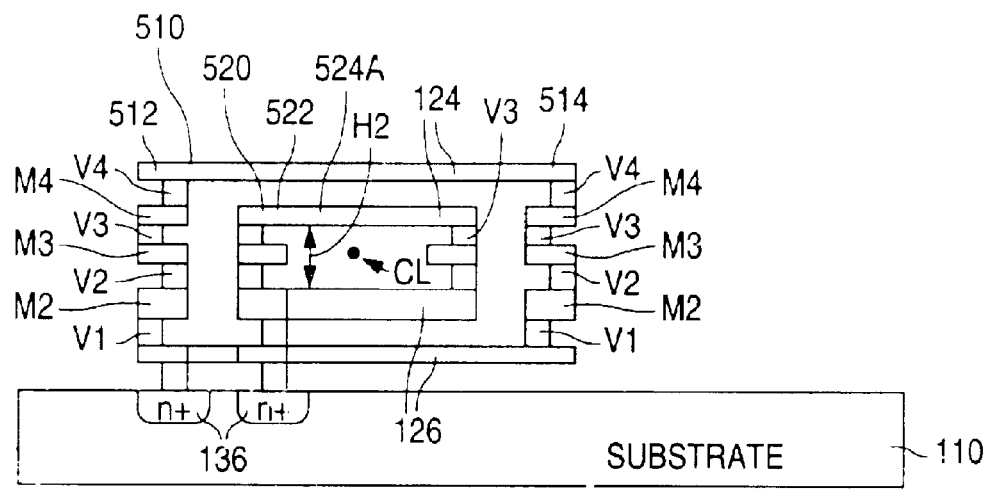

FIGS. 5A–5C show views that illustrate a high Q inductance system 500 in accordance with the present invention. FIG. 5A shows a plan view of system 500. FIG. 5B shows a side view taken along line 5B—5B of FIG. 5A. FIG. 5C shows an end view taken along line 5C—5C of FIG. 5A.

As shown in FIGS. 5A–5C, system 500, which can be implemented as, for example, a transformer, includes a first inductor 510 that has a longitudinal centerline CL, and a conductor 512 that spirals around centerline CL a number of times to form a number of loops 514.

In addition, system 500 includes a second inductor 520 that has a conductor 522 that spirals around the longitudinal centerline CL a number of times to form a number of loops 524 that are formed inside of the loops 514 of first inductor 510. (Inductor 512 can have the same or a different number of loops as inductor 510.)

The loops 514 include a first loop 514A, a number of intermediate loops 514B, and a last loop 514C, while the loops 524 include a first loop 524A, a number of intermediate loops, and a last loop. In the example shown in FIGS. 5A–5C, first inductor 510 and second inductor 520 are both formed as inductor 100 with different heights.

In the example shown in FIGS. 5A–5C, inductor 510 has a height H1, and uses the metal-1 layer to form the bottom segment 126 of a loop 514, and the metal-S layer to form the top segment 124 of a loop 516. Inductor 520 has a smaller height H2, and uses the metal-2 layer to form the bottom segment 126 of a loop 524, and the metal-4 layer to form the top segment 124 of a loop 524.

Figure 6A:
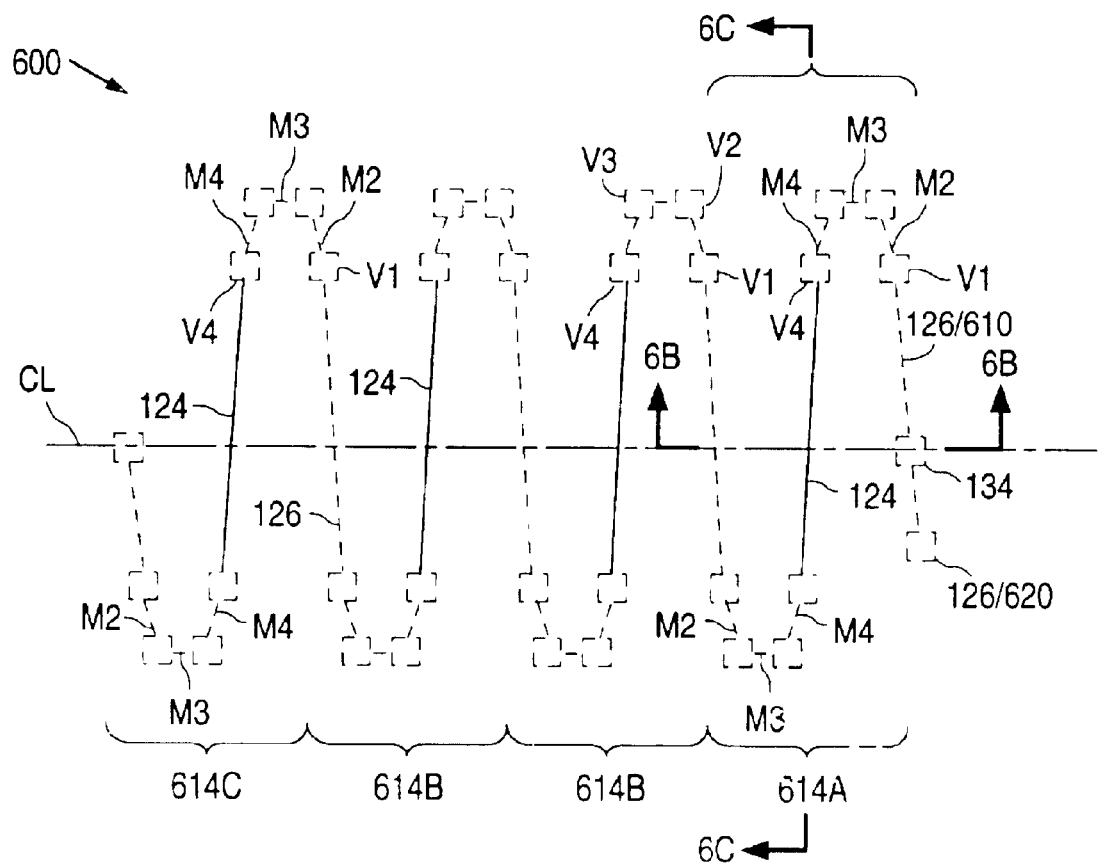
FIGS. 6A–6C are views illustrating a high Q inductance system 600 in accordance with the present invention.
Figure 6B:
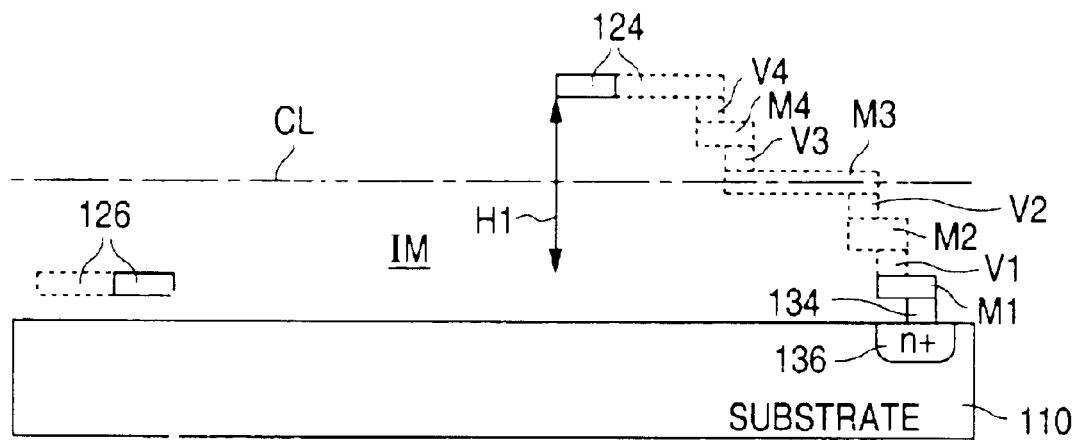
Figure 6C:
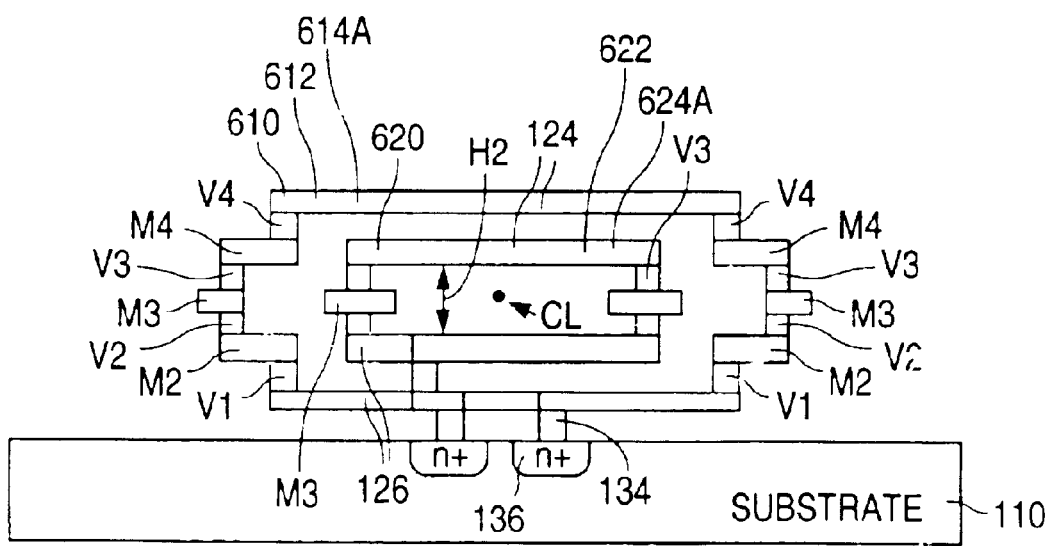

FIGS. 6A–6C show views that illustrate a high Q inductance system 600 in accordance with the present invention. FIG. 6A shows a plan view of system 600. FIG. 6B shows a side view taken along line 6B—6B of FIG. 6A. FIG. 6C shows an end view taken along line 6C—6C of FIG. 6A.

As shown in FIGS. 6A–6C, system 600, which can be implemented as, for example, a transformer, includes a first inductor 610 that has a longitudinal centerline CL, and a conductor 612 that spirals around centerline CL a number of times to form a number of loops 614.

In addition, system 600 includes a second inductor 620 that has a conductor 622 that spirals around the longitudinal centerline CL a number of times to form a number of loops 624 that are formed inside of the loops 614 of first inductor 610. (Inductor 612 can have the same or a different number of loops as inductor 610.)

The loops 614 include a first loop 614A, a number of intermediate loops 614B, and a last loop 614C, while the loops 624 include a first loop 624A, a number of intermediate loops, and a last loop. In the example shown in FIGS. 6A–6C, first inductor 610 and second inductor 620 are both formed as inductor 200 with different heights.

In the example shown in FIGS. 6A–6C, inductor 610 has a height H1, and uses the metal-1 layer to form the bottom segment 126 of a loop 614, and the metal-5 layer to form the top segment 124 of a loop 614. Inductor 620 has a smaller height H2, and uses the metal-2 layer to form the bottom segment 126 of a loop 624, and the metal-4 layer to form the top segment 124 of a loop 624. Thus, system 600 is similar to system 500 except that system 600 utilizes inductor 200 to form inductors 610 and 620.

One of the advantages of the present invention is that a high Q inductor can be formed as part of the standard backend wafer processing steps without the need for any additional steps. Contact 134 is formed at the same time that the other contacts are formed on the rest of the wafer, while metal region M1 and each metal-1 bottom segment 126 are formed at the same time that the other metal-1 lines and traces are formed on the rest of the wafer.

Similarly, each metal region M2, M3, and M4 is formed at the same time that the metal-2, metal-3, and metal-4 lines and traces, respectively, are formed on the rest of the wafer. In addition, the metal-5 top segment 124 is formed at the same time that the other metal-5 lines and traces are formed on the rest of the wafer.

Further, each of the metal regions M1, M2, M3, and M4, metal-1, metal-2, metal-4, and metal-5 lines, and vias V1–V4 are formed in and surrounded by an insulating material IM. Insulating material IM can be implemented with, for example (but not limited to), oxide, oxide-nitride, low-K dielectrics, and air. In addition, insulating material IM can be formed from one material, or as a combination of different layers of insulating materials. Although the invention has been described in terms of five metal layers, other numbers of metal layers can also be used. (The minimum number of metal layers is two).

Thus, the present invention provides a high Q inductor and an inductance system that is formed on the wafer as part of the multi-level interconnect, thereby allowing further reductions in the size of RF devices, such as digital cellular telephones.

It should be understood that the above descriptions are examples of the present invention, and various alternatives to the embodiment of the invention described herein may be employed in practicing the invention. For example, although the present invention has been described with respect to a single inductor or two inductors which are formed around the same centerline, n inductors can be formed around the same centerline (where n represents an integer). Thus, it is intended that the following claims define the scope of the invention and that methods and structures within the scope of these claims and their equivalents be covered thereby.

What is claimed is:

1. An inductive system formed over a semiconductor substrate, the system comprising:

a first inductor having a longitudinal centerline and a first conductor that spirals around the longitudinal centerline a plurality of times to form a plurality of loops, each loop having:

a first vertical segment having a plurality of first vias, the first vertical segment being vertical with respect to a surface of the substrate, each first via being vertically spaced apart, no first via being formed directly vertically over another first via, a second vertical segment having a plurality of second vias, the second vertical segment being vertical with respect to the surface of the substrate, each second via being vertically spaced apart, no second via being formed directly vertically over another second via, a first horizontal segment that is connected to the first vertical segment and the second vertical segment, the first horizontal segment being horizontal with respect to the surface of the substrate, and a second horizontal segment that is connected to the second vertical segment, the second horizontal segment being horizontal with respect to the surface of the substrate.

2. The inductive system of claim 1 and further including a plurality of metal regions, a metal region being formed between, and connected to, each vertically-adjacent pair of first vias.

3. The inductive system of claim 2 wherein alternating metal regions are not vertically formed over each other.

4. The inductive system of claim 1 and further comprising:

a second inductor having a second conductor that spirals around the longitudinal centerline a plurality of times to form a plurality of loops, each loop of the second conductor having:

a third vertical segment having a third via;
a fourth vertical segment having a fourth via,
a third horizontal segment that is connected to the third via and the fourth via, and
a fourth horizontal segment that is connected to the fourth vertical segment.

5. The inductive system of claim 4 wherein the longitudinal centerline is approximately parallel with a top surface of the semiconductor substrate.

6. The inductive system of claim 4 wherein the fourth horizontal segment of the second loop lies directly below the first horizontal segment of the first loop.

7. The inductive system of claim 6 wherein the third vertical segment includes a plurality of third vias, each third via being vertically spaced apart.

8. The inductive system of claim 7 wherein no third via is formed directly vertically over another third via.

9. An inductive system formed over a semiconductor substrate, the system comprising:
   a first inductor having a longitudinal centerline and a first conductor that spirals around the longitudinal centerline a plurality of times to form a plurality of loops, each loop having:
      a first vertical segment having a plurality of first vias, the first vertical segment being vertical with respect to a surface of the substrate, each first via being vertically spaced apart,
      a second vertical segment having a second via, the second vertical segment being vertical with respect to the surface of the substrate,
      a first horizontal segment that is connected to the first via and the second via, the first horizontal segment being horizontal with respect to the surface of the substrate, and
      a second horizontal segment that is connected to the second vertical segment, the second horizontal segment being horizontal with respect to the surface of the substrate;
   a second inductor having a second conductor that spirals around the longitudinal centerline a plurality of times to form a plurality of loops, each loop of the second conductor having:
      a third vertical segment having a third via;
      a fourth vertical segment having a fourth via,
      a third horizontal segment that is connected to the third via and the fourth via, and
      a fourth horizontal segment that is connected to the fourth vertical segment;
   the first inductor having a first width measured along a first line that is normal to the longitudinal centerline and parallel to the surface of the substrate; and
   the second inductor having a second width measured along a second line that is normal to the longitudinal centerline and parallel to the surface of the substrate, the first and second widths being approximately equal.

10. The inductive system of claim 9 wherein no first via is formed directly vertically over another first via.

11. The inductive system of claim 9 wherein the longitudinal centerline is approximately parallel with a top surface of the semiconductor substrate.

12. The inductive system of claim 11 wherein the third vertical segment includes a plurality of third vias, each third via being vertically spaced apart.

13. The inductive system of claim 12 wherein no third via is formed directly vertically over another third via.

14. An inductor formed over a semiconductor substrate, the inductor comprising:
   a longitudinal centerline and a conductor that spirals around the longitudinal centerline a plurality of times to form a plurality of loops, each loop having:
   a first vertical segment having a plurality of first vias, the first vertical segment being vertical with respect to a surface of the substrate, each first via being vertically spaced apart, no first via being formed directly vertically over another first via,
   a second vertical segment having a plurality of second vias, the second vertical segment being vertical with respect to the surface of the substrate, each second via being vertically spaced apart, no second via being formed directly vertically over another second via,
   a first horizontal segment that is connected to the first vertical segment and the second vertical segment, the first horizontal segment being horizontal with respect to the surface of the substrate, and
   a second horizontal segment that is connected to the second vertical segment, the second horizontal segment being horizontal with respect to the surface of the substrate.

15. The inductor of claim 14 wherein the longitudinal centerline is approximately parallel with a top surface of the semiconductor substrate.

16. The inductor of claim 14 and further including a dielectric material that isolates adjacent loops.

17. The inductor of claim 16 wherein the dielectric material includes oxide or oxide-nitride.

18. The inductor of claim 14 wherein the inductor has an end.

19. The inductor of claim 18 wherein the end is connected to a heavily-doped region formed in the semiconductor substrate.

20. The inductor of claim 18 wherein the end is connected to a metal lead.

* * * * *

UNITED STATES PATENT AND TRADEMARK OFFICE
CERTIFICATE OF CORRECTION

PATENT NO. : 6,833,781 B1  
DATED : December 21, 2004  
INVENTOR(S) : Padmanaban et al.

It is certified that error appears in the above-identified patent and that said Letters Patent is hereby corrected as shown below:

Title page,
Item [54], Title, after "INDUCTOR" insert -- FORMED --.

Column 3,
Line 16, delete "metal-S" and replace with -- metal-5 --.

Column 5,
Line 13, delete "metal-S" and replace with -- metal-5 --.

Signed and Sealed this

Twenty-ninth Day of March, 2005

JON W. DUDAS
*Director of the United States Patent and Trademark Office*